United States Patent [19]

Masuda et al.

[11] 4,399,519

[45] Aug. 16, 1983

[54] DYNAMIC MONOLITHIC MEMORY

[75] Inventors: Hiroo Masuda, Kodaira; Katsuhiro Shimohigashi, Musashimurayama, Japan

[73] Assignee: Hitachi, Ltd., Tokyo, Japan

[21] Appl. No.: 188,244

[22] Filed: Sep. 17, 1980

[30] Foreign Application Priority Data

Sep. 19, 1979 [JP] Japan ................. 54-119403

[51] Int. Cl.³ ............... G11C 7/00; G11C 11/24
[52] U.S. Cl. ................... 365/149; 365/189; 365/203
[58] Field of Search ............ 365/203, 149, 189

[56] References Cited

U.S. PATENT DOCUMENTS 4,112,508  9/1978  Itoh ................. 365/203
4,138,740  2/1979  Itoh ................. 365/203

Primary Examiner—George G. Stellar
Attorney, Agent, or Firm—Antonelli, Terry & Wands

[57] ABSTRACT

In a dynamic monolithic memory including a plurality of memory cells each of which comprises a capacitance and a switching field-effect transistor, the source and drain electrodes of the transistor are connected to a data line and the capacitance, respectively. Upon reading a memory cell, the transistor is switched on when difference between the data line voltage and the word line voltage applied to a gate electrode of the transistor exceeds a threshold voltage of the transistor.

16 Claims, 8 Drawing Figures

DYNAMIC MONOLITHIC MEMORY

BACKGROUND OF THE INVENTION

The present invention relates to semiconductor memories with a high-speed operation and particularly to a dynamic monolithic memory of complementary type including an N-channel field-effect transistor and a P-channel field-effect transistor.

Recently, a dynamic memory using memory cells each of which comprises a single N-channel metal oxide field-effect transistor (hereinafter, referred to as NMOS) and a capacitor has been put into practical use. This kind of memory has a defect that it takes much time to read information from a memory cell to a data line. This is due to the fact that the data line is connected to the drain electrode of an NMOS within a memory cell.

That is, when a memory cell is selected, the voltage across the capacitance is increased by the influence of the voltage on the data line. Thus, in the NMOS within the cell, the voltage between the source connected to a terminal of this capacitance and the gate connected to a word line is not rapidly increased when the voltage on the word line is increased. Therefore, because of a slight increase of the conductance of NMOS, much time is required for the information within the cell to be completely read therefrom to the data line. This forces the start of a succeeding detecting amplifier operation to be delayed, and thus a large amount of time is taken up before the information in the memory cell is used by the external circuit.

This problem will also occur in the P-channel metal oxide field-effect transistor (hereinafter, referred to as PMOS).

LIST OF PRIOR ART (37 CFR 1.56(a))

The following references are cited to show the state of the art:

Japanese patent application Laid-Open No. 54987/78 published on May 18, 1978;

U.S. Pat. No. 4,151,610 issued on Apr. 24, 1979;

Japanese patent application Laid-open No. 107278/79 which is a basis for claiming priority of U.S. patent application Ser. No. 777,664; and U.S. Pat. No. 4,044,340 issued on Aug. 30, 1977.

SUMMARY OF THE INVENTION

Accordingly, it is an object of the invention to provide a dynamic monolithic memory capable of high-speed reading.

To this end, in the present invention, a field-effect transistor for connecting an information storing capacitance and a data line is provided. The drain and source electrodes of this transistor are connected to the capacitance and data line, respectively. By virtue of this type of connection the operation speed is enhanced, as discussed hereafter.

DESCRIPTION OF THE PREFERRED EMBODIMENTS

Figure 1:
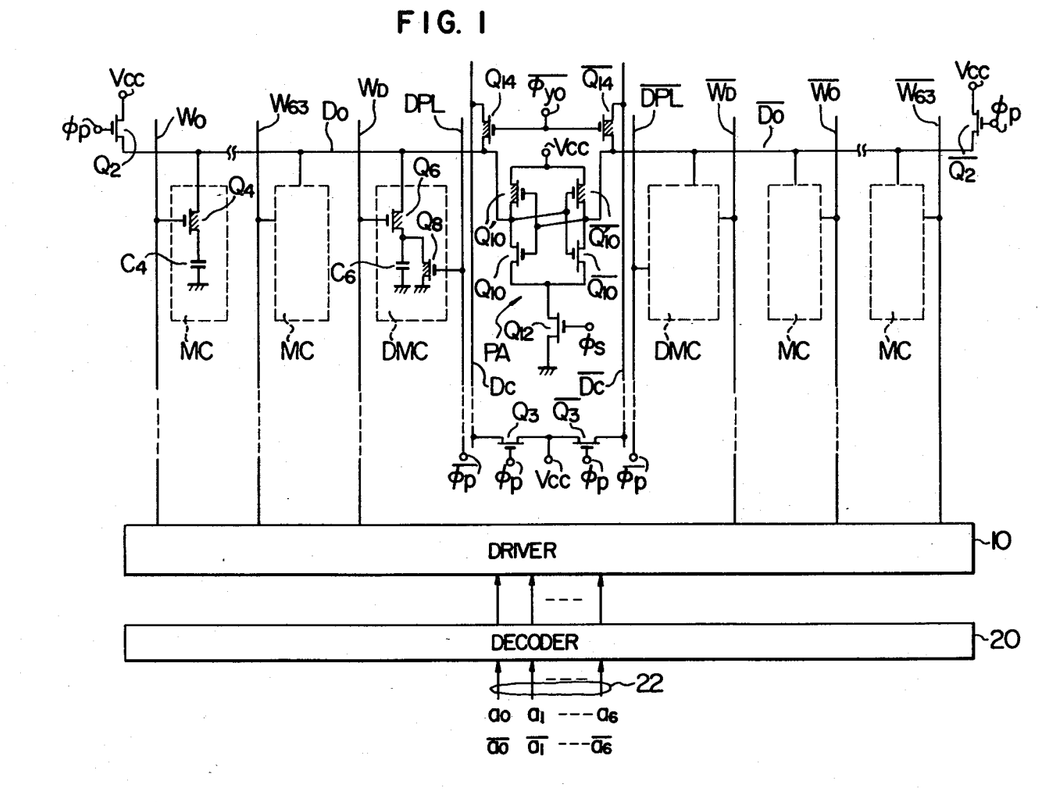
FIG. 1 is a schematic circuit diagram of the first embodiment of the dynamic memory according to the invention.

FIG. 1 shows a first embodiment of this invention.

Referring to FIG. 1, there are shown a pair of data lines $D_0$ and $\overline{D}_0$ which are connected to a preamplifier PA. Across the data line $D_0$ there are provided 64 word lines $W_0$ to $W_{63}$ for selecting memory cells and a word line $W_D$ for selecting a dummy cell, while across the data line $\overline{D}_0$ are provided 64 word lines $\overline{W}_0$ to $\overline{W}_{63}$ for selecting memory cells and a word line $\overline{W}_D$ for selecting a dummy cell. At the intersections between the word lines $W_0$ to $W_{63}$ and the data line $D_0$ and between the word lines $\overline{W}_0$ to $\overline{W}_{63}$ and the data line $\overline{D}_0$ there are provided memory cells MC, while at the intersections between the word line $\overline{W}_D$ for the dummy cell and the data line $\overline{D}_0$ and between the word line $W_D$ for the dummy cell and the data line $D_0$ there are provided dummy cells DMC. Each of the memory cells MC consists of a PMOS $Q_4$ and a capacitance $C_4$ connected to the drain of the PMOS $Q_4$. The PMOS $Q_4$ has its gate connected to the associated word line and its source connected to the associated data line. On the other hand, each of the dummy cells DMC consists of a PMOS $Q_6$, capacitance $C_6$ connected to the drain of the PMOS $Q_6$, and a PMOS $Q_8$ connected between the drain of the PMOS $Q_6$ and ground to discharge the capacitance $C_6$. The capacitance $C_6$ is usually designed to have half the value of the capacitance $C_4$.

All the NMOS's and PMOS's used in the embodiments of the invention are of enhancement type. The memory in FIG. 1 actually includes, for example, 64 pairs of data lines, but for the sake of simplicity only a pair of data lines $D_0$ and $\overline{D}_0$ are shown in FIG. 1. Each of the data line pairs are connected to common data lines $D_c$ and $\overline{D}_c$ through PMOS's $Q_{14}$ and $\overline{Q}_{14}$, respectively. The sources and drains of the PMOS's $Q_{14}$ and $\overline{Q}_{14}$ are connected to the common data lines ($D_c$, $\overline{D}_c$) and the data lines ($D_0$, $\overline{D}_0$) respectively. To the common data lines $D_c$ and $\overline{D}_c$ are connected a main amplifier (not shown) for amplifying the voltage difference therebetween, as in previously known memory arrangements. Upon selection of a memory cell, a decoder 20 is responsive to 14 address signals $a_0, a_1, \ldots a_6, \overline{a}_0, \overline{a}_1, \ldots \overline{a}_6$ supplied through lines 22 to control a word line driver 10 to selectively excite a word line to which a memory cell to be selected is connected, for example, the word line $W_0$ and selectively drive, the word line $W_D$ for the dummy cell intersecting with the data line $\overline{D}_0$ making a pair with the data line $D_0$ to which the memory cell to be selected is connected. Here, the address signals $a_0, a_1, \ldots a_6$ are the complements of the address signals $a_0, a_1, \ldots a_6$, respectively.

Figure 2:
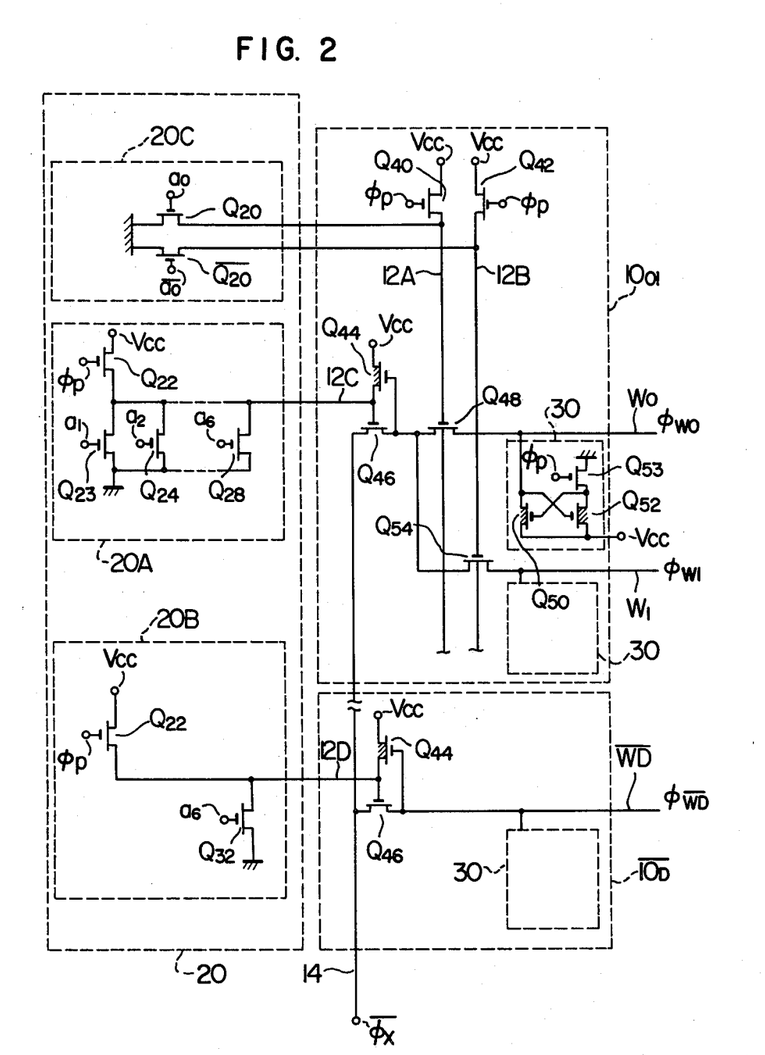
FIG. 2 is a detailed circuit diagram of the decoder and driver in the first embodiment.

FIG. 2 shows the decoder 20, a driver $10_{01}$ for driving the word lines $W_0$ and $W_1$ and a driver $10_D$ for driving the word line $\overline{W}_D$ for dummy cell. In the decoder 20, as illustrated, there are shown only a first partial decoder 20A for selecting a pair of word lines $W_0$ and $W_1$, a second partial decoder 20B for selecting the dummy word line $\overline{W}_D$ and a third partial decoder 20C for selecting one counterpart of the pair of word lines selected by the first partial decoder 20A. The first partial decoders for selecting the word lines for other memory cells and the second partial decoder for selecting the word line $W_D$ for the dummy cells are not shown for the sake of simplicity. In this embodiment, the first partial decoders for selecting word lines $W_0$ to $W_{63}$, and $\overline{W}_0$ to $\overline{W}_{63}$ for memory cells are respectively provided commonly to two adjacent word lines, and has the same construction as that of the illustrated first partial decoder 20A except for the fact that different address signals are applied to the input.

That is, each of the first partial decoders 20A or the like has six NMOS $Q_{23}$ to $Q_{28}$ to which six address signals are to be applied, the six address signals being $a_1$ or $\overline{a}_1$, $a_2$ or $\overline{a}_2$, $\ldots$, and $a_6$ or $\overline{a}_6$. When these address signals are all at low level, the two word lines connected to the first partial decoders 20A or the like are selected. For example, the first partial decoder 20A for selecting the word lines $W_0$ and $W_1$ is supplied with the address signals $a_1, a_2, \ldots a_6$ as illustrated. On the other hand, for example, the first partial decoder (not shown) for selecting word lines $W_2$ and $W_3$ (not shown) is supplied with $\overline{a}_1, a_2, \ldots a_6$.

A pair of adjacent word lines are first selected by a corresponding first partial decoder, and one counterpart of the selected pair of word lines is selected by output lines 12A and 12B of NMOS's $Q_{20}$ and $\overline{Q}_{20}$ in the third partial decoder 20C. Thus, one word line to be selected is driven. The lines 12A and 12B are commonly connected to a plurality of drivers for memory cell.

The second partial decoder 20B has an NMOS $Q_{32}$ to which only the address signal $a_6$ is applied, so as to select the word line $\overline{W}_D$ for the dummy cell when the address signal $a_6$ is at low level. Similarly, the second partial decoder (not shown) for selecting the word line $W_D$ is constructed to select the word line $W_D$ for the dummy cell when the address signal $\overline{a}_6$ is at low level.

The driver $10_{01}$ is formed of a latch circuit 30, NMOS's $Q_{48}$ and $Q_{54}$ connected to the word lines $W_0$ and $W_1$, respectively, and NMOS $Q_{46}$ and PMOS $Q_{44}$ which are connected commonly to the NMOS's $Q_{48}$ and $Q_{54}$. The NMOS's $Q_{48}$ and $Q_{54}$ are controlled by the voltages on the lines 12A and 12B. The other word lines $W_3$ to $W_{63}$, and $\overline{W}_0$ to $\overline{W}_{63}$ have also the latch circuit 30, the NMOS's $Q_{46}, Q_{48}$ and $Q_{54}$ and the PMOS $Q_{44}$ (all not shown). The driver $\overline{10}_D$ do not have NMOS's $Q_{48}$ and $Q_{54}$, which is the only point in which it is different from the driver $10_{01}$. The driver (not shown) for selecting the word line $W_D$ is also quite the same as the driver $\overline{10}_D$. The NMOS $Q_{46}$ is supplied at its source with a pulse $\phi_x$ which changes from high to low level, and at its gate with a select output from the partial decoder 20A or 20B. The drain of the NMOS $Q_{46}$ connected to the word line ($W_0$ and so on) is connected to the sources of the NMOS's $Q_{48}$ and $Q_{54}$. The drain of the NMOS $Q_{46}$ connected to the dummy word line ($\overline{W}_D$ and so on) is connected directly to the dummy word line ($\overline{W}_D$ and so on).

The operation of the circuits of FIGS. 1 and 2 will be described with reference to the timing chart of FIG. 3.

Figure 3:
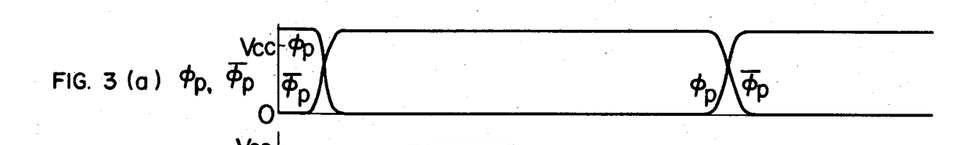
FIG. 3 is a timing chart of signals useful for explaining the operation of the memory of the first embodiment.

A precharge signal $\phi_p$ of high level as shown by FIG. 3(a) is applied to the NMOS's $Q_2, \overline{Q}_2, Q_3$, and $\overline{Q}_3$ so that the power source voltage $V_{cc}$ (5 volts) applied to the drains thereof precharges the data lines $\overline{D}_o$ and $D_o$ and common data lines $D_c$ and $\overline{D}_c$. Therefore, the signal $\phi_p$ of high level is selected to be higher than the voltage $V_{cc}$ by the threshold voltage of NMOS's $Q_2, \overline{Q}_2, Q_3$ and $\overline{Q}_3$. Also, the precharge signal $\phi_p$ is applied to the NMOS $Q_{53}$ of the latch circuit 30 which is connected to each word line, and thereby turns it on to make the gate of the PMOS $Q_{50}$ and the drain of the PMOS $Q_{52}$ at zero volt. As a result, the PMOS $Q_{50}$ is turned on and the $Q_{52}$ is off. Thus, each word line is precharged to and latched at the voltage $V_{cc}$. On the other hand, the signal $\overline{\phi}_p$ into which the signal $\phi_p$ is inverted is applied to the PMOS $Q_8$ in the dummy cell DMC through the dummy cell precharge lines DPL and $\overline{DPL}$ and thereby turns it on to make the capacitance $C_6$ store low voltage (zero volt).

The signal $\phi_p$ makes the NMOS $Q_{22}$ in the first and second partial decoders 20A and 20B turn on so that the lines 12C and 12D are precharged at the voltage $V_{cc}$ and the gates of the word line driving transistors $Q_{46}$ at the voltage $V_{cc}$ with the NMOS's $Q_{46}$ kept in the onstate. Furthermore, the signal $\phi_p$ causes the NMOS's $Q_{40}$ and $Q_{42}$ in the driver $10_{01}$ to turn on, thereby making the NMOS's $Q_{48}$ and $Q_{54}$ conductive through the lines 12A and 12B. At precharge, all the address signals $a_0$ to $a_6$ and $\overline{a}_0$ to $\overline{a}_6$ are at low level, thereby keeping the NMOS's $Q_{20}, \overline{Q}_{20}$ in off-state. Thus, the NMOS's $Q_{46}, Q_{48}$ and $Q_{54}$ are all turned on which are connected to all the word lines. At this time, as shown in FIG. 3(c), when the signal $\phi_p$ is at high level, the word line driving signal $\overline{\phi}_x$ is at high level. Therefore, under this precharged state, all the word lines are maintained at the voltage $V_{cc}$. Thereafter, the signals $\phi_p$ and $\overline{\phi}_p$ are changed to low and high level, respectively. Thus, the precharging terminates.

Subsequently, an address signal is applied to the decoder 20 as shown in FIG. 3(b). If this signal is now for selecting the word line $W_0$, the signals $a_0$ to $a_6$ are all at low level, and the signals $\overline{a}_0$ to $\overline{a}_6$ are all at high level. Thus, the NMOS's $Q_{23}$ to $Q_{28}$ in the first partial decoder 20A for the word lines $W_0$ and $W_1$ all stay in the off-state with the result that the output line 12C of the first partial decoder 20A is kept at high level, and NMOS $Q_{46}$ which is connected to the word line $W_0, W_1$ is maintained conductive. Similarly, the output line 12D of the second partial decoder 20B is kept at high level and the NMOS $Q_{46}$ within the driver $\overline{10}_D$ is kept conductive. The first partial decoders connected to the other word lines are supplied with address signals of which at least one signal is at high level, and thus produce a signal of low level which turns the NMOS $Q_{46}$ connected to the respective word lines, off. Thus, the word lines except the word lines $W_0, W_1$, and $\overline{W}_D$ are not supplied with the signal $\overline{\phi}_x$. As a result, these word lines are maintained at voltage $V_{cc}$ by the latch circuit 30.

On the other hand, the NMOS's $Q_{20}$ and $\overline{Q}_{20}$ within the second partial decoder 20C respond to the address signals $a_0$ and $\overline{a}_0$ of low and high levels and come into the off- and on-states, respectively. The line 12A is thus kept at high level but the line 12B discharges to low level through the NMOS $\overline{Q}_{20}$. Consequently, the NMOS's $Q_{48}$ in all the drivers remain conductive but the NMOS's $Q_{54}$ therein become nonconducting. Thus, the signal $\phi_x$ is no longer applied to the word line $W_1$.

In this way, only the selected word line $W_0$ and the dummy word line $\overline{W}_D$ continue to be supplied with the signal $\overline{\phi}_x$.

Then, when the signal $\overline{\phi}_x$ is shifted to low level as shown in FIG. 3(c), the voltage, $\phi_{W0}$ on the selected word line $W_0$ is rapidly discharged to low level through the NMOS's $Q_{46}$ and $Q_{48}$ in the driver $10_{01}$ as shown in FIG. 3(d),. The voltage, $\phi_{WD}$ on the dummy word line $W_D$ is also discharged to low level through the NMOS $Q_{46}$ in the driver $\overline{10}_D$.

During the discharge, the voltage difference between the source and gate electrodes of the NMOS's $Q_{46}$ and $Q_{48}$ is increased, and thus the discharge is rapidly performed.

At this time, the lines 14 and 12c are capacitively coupled and thus when the signal $\overline{\phi}_x$ is shifted from high level to low level, the voltage on the output line 12C of the first partial decoder 20A may be reduced to less than the voltage $V_{cc}$. This reduction is prevented by the PMOS $Q_{44}$, which has its drain connected to the gate of the NMOS $Q_{46}$, its gate connected to the drain of the NMOS $Q_{46}$, and its source connected to the constant voltage $V_{cc}$. The PMOS $Q_{44}$ for the word lines not selected is in the off-state since its gate voltage is $V_{cc}$. The PMOS $Q_{44}$ for the word lines $W_0$ and $\overline{W}_D$ selected becomes conductive when the $\phi_{W0}$ and $\phi_{\overline{WD}}$ are at low level, because the gate voltage is reduced to much less than the source voltage $V_{cc}$. Thus, the gate voltage of the NMOS $Q_{46}$ is maintained at $V_{cc}$. The lines 12A and 12B are also decreased in level by capacitive coupling when the $\overline{\phi}_x$ is lowered, but the amount of the reduction is small because the capacitance of the lines 12A and 12B is large. Thus, any PMOS corresponding to PMOS $Q_{44}$ is not provided.

When the word lines $W_0$ and $\overline{W}_D$ are discharged with the result that the $\phi_{W0}$ and $\phi_{\overline{WD}}$ become smaller than $V_{cc}-|V_{TH}(Q_4)|$ and $V_{cc}-|V_{TH}(Q_6)|$, respectively, the PMOS $Q_4$ in the memory cell MC and the PMOS $Q_6$ in the dummy cell DMC become conductive. Where, $V_{TH}(Q_4)$ and $V_{TH}(Q_6)$ represent threshold values of PMOS's $Q_4$ and $Q_6$, respectively, and hereinafter similar expression will be used for a threshold of NMOS or PMOS.

As will be described later, the capacitance $C_4$ stores zero volt and $V_{cc}$ volt, and the data lines $D_0$, $\overline{D}_0$ are at $V_{cc}$ when they are precharged. Therefore, at the beginning of reading of the memory cell, the potential of the first electrode connected to the data line $\overline{D}_0$ of the PMOS $Q_4$ never becomes smaller than the potential of the second electrode of the PMOS $Q_4$ connected to the capacitance $C_4$. Thus, the PMOS $Q_4$ operates with its first and second electrodes as the source and drain, respectively. Consequently, when the voltage $\phi_{W0}$ on the word line $W_0$ is changed, the PMOS $Q_4$ starts to become conductive under the condition that the difference between the $\phi_{W0}$ and the source voltage exceeds the threshold value, $|V_{TH}(Q_4)|$. This is also the case for the PMOS $Q_6$, and usually $V_{TH}(Q_4) = V_{TH}(Q_6)$ is satisfied.

When the PMOS $Q_4$ in the memory cell MC is turned on, the potential of the data line $D_0$ is reduced by the value corresponding to the voltage stored in the capacitance $C_4$ in the memory cell MC. This capacitance voltage is established to be $V_{cc}$ or zero volt in response to the state, "1" or "0" of the information stored in the memory cell MC. Thus, as shown in FIG. 3(e), when "1" is read from the memory cell MC, the potential on the data line $D_0$ almost remains $V_{cc}$, but when "0" is read from the memory cell MC, the potential on the data line becomes slightly lower than $V_{cc}$. On the other hand, since zero volt is stored in the capacitance within the dummy cell DMC at the time of precharge, the potential on the data line $\overline{D}_0$ becomes slightly lower than the $V_{cc}$ when the dummy cell is read. In order for the potential on the data line $\overline{D}_0$ to be positioned midway between the two values which the data line $D_0$ can take, the capacitance $C_6$ is designed to have about a half of the value of the capacitance $C_4$. Since the values of the capacitances $C_4$, $C_6$ are selected to be the capacitance of the data lines $D_0$, $\overline{D}_0$, divided by several tens or hundreds, even if the potential of the data lines $D_0$, $\overline{D}_0$ is changed from $V_{cc}$, the amount of change will be as small as several tens of millivolts to hundreds millivolts. Therefore, it can be considered that the voltages of the data lines $D_0$, $\overline{D}_0$ remain about $V_{cc}$.

Meanwhile, when the signal $\phi_{W0}$ continues to decrease toward zero volt, the potential difference between the potential of the gate of the PMOS $Q_4$ connected to the word line $W_0$ and the potential of the source connected to the data line $D_0$ are increased more, and thus the PMOS $Q_4$ increases its conductance. Consequently, as the signal $\phi_{W0}$ decreases, the conductivity of the PMOS $Q_4$ increases. Thus, as described above, information is rapidly read from the memory MC and supplied to the data line $D_0$. Similarly, from the memory DMC is rapidly read for information and it is supplied to the data line $\overline{D}_0$.

The voltages on the lines $D_0$ and $\overline{D}_0$ are thus rapidly changed upon reading of the memory cell and the dummy cell. The potentials on the data lines $D_0$ and $\overline{D}_0$ are differentially amplified by the preamplifier PA of flip-flop configuration consisting of NMOS's $Q_{10}$ and $\overline{Q}_{10}$ and PMOS's $Q'_{10}$ and $\overline{Q}'_{10}$. As shown in FIG. 3(f), the signal $\phi_s$ increases from low level to high level, thereby turning on an NMOS $Q_{12}$ to activate the preamplifier PA. As a result, either the pair of NMOS $Q_{10}$ and PMOS $\overline{Q}'_{10}$ or the pair of NMOS $\overline{Q}_{10}$ and PMOS $Q'_{10}$ is turned on and the other pair is turned off, depending upon the voltage difference between the data lines $D_0$ and $\overline{D}_0$. For example, as shown in FIG. 3(e), when the voltage on the data line $D_0$ is larger than that on the data line $\overline{D}_0$, the NMOS $Q_{10}$ and PMOS $\overline{Q}'_{10}$ are turned off, and the NMOS $\overline{Q}_{10}$ and PMOS $Q'_{10}$ are turned on. Consequently, the voltage on the data line $\overline{D}_0$ is rapidly discharged toward zero volt as shown in FIG. 3(e), whereas the voltage on the data line $\overline{D}_0$ does not change. Subsequently, when the signal $\overline{\phi}_{y0}$ to be supplied to the gates of the PMOS's $Q_{14}$ and $\overline{Q}_{14}$ for the memory MC to be read is changed from high to low level to thereby turn on the PMOS's $Q_{14}$ and $\overline{Q}_{14}$, the common data line $D_c$ is maintained at high level and the common data line $\overline{D}_c$ is changed to low level, by the action of a main amplifier (not shown). From the voltage change of the common data line $D_c$, $\overline{D}_c$ can be seen the information which is stored in the memory cell read out. Since the data lines $D_0$ and $\overline{D}_0$ and common data lines $D_c$ and $\overline{D}_c$ are connected by the PMOS's $Q_{14}$ and $\overline{Q}_{14}$, respectively, the voltage of the common lines is more rapidly changed than use of NMOS's. That is, as the signal $\overline{\phi}_{y0}$ is changed from high to low level, the difference between the source and gate voltages of the PMOS's $Q_{14}$, $\overline{Q}_{14}$ is increased, and therefore the PMOS's $Q_{14}$, $\overline{Q}_{14}$ increases its conductance. After this reading operation, all the signals are returned to the signal at the time of precharge as shown in FIG. 3. In this way, reading operation is finished.

In this memory, to store information at memory cells, the following steps are taken. After information is read from the memory cell into which information is to be written as stated above, the signal associated with the reading operation is returned to the level at the time of precharge after the common data line $D_c$, $\overline{D}_c$ is supplied with $V_{cc}$ or zero volt in response to the "1" or "0" of information to be written. The voltage of the data line $D_0$, $\overline{D}_0$ is changed to the $V_{cc}$ or low level in response to the information to be written, and then the signals associated with reading operation are all returned to the level at the time of precharge. Thus, writing operation is finished.

Figure 4:
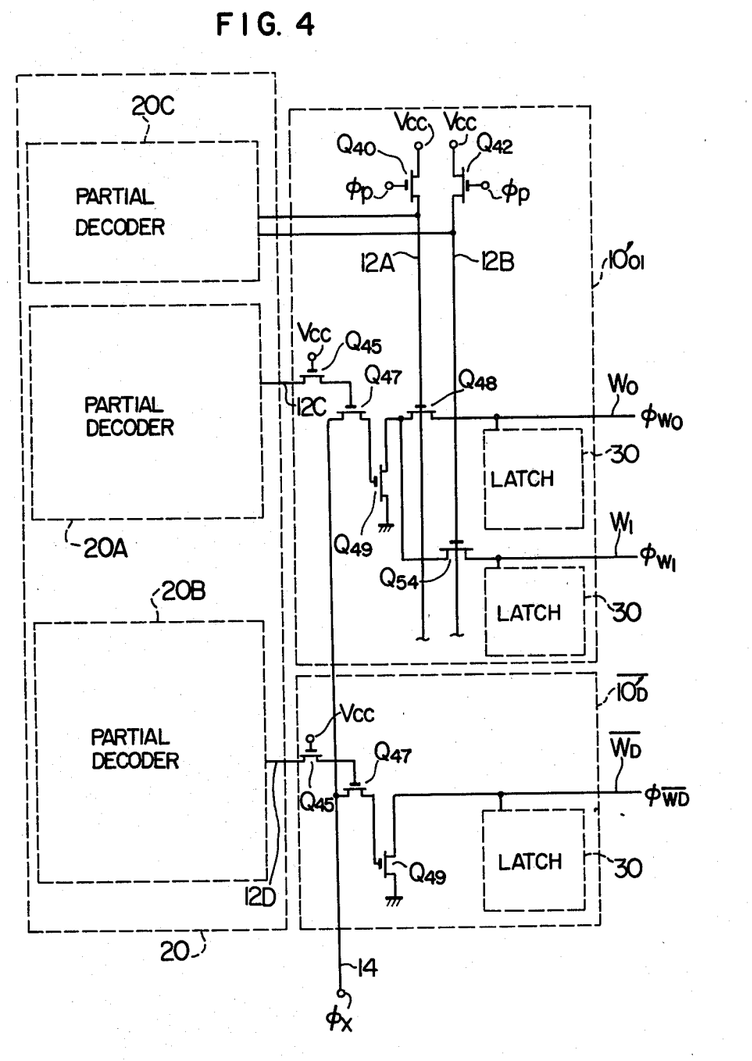
FIG. 4 is a schematic circuit diagram of the driver and decoder of the second embodiment of the dynamic memory according to the invention

FIG. 4 shows a second embodiment of the invention relating to the decoder and driver. In FIG. 4, like elements corresponding to those of FIG. 2 are identified by the same reference numerals. The decoder 20 in FIG. 4 is quite the same as in FIG. 2, but the driver, $10'_{01}$ is different from that in FIG. 2. The driver $10'_{01}$ for the word line $W_0$, $W_1$ is connected through an NMOS $Q_{45}$ to the output line 12C of the decoder 20A, and discharge on the word line is performed by use of NMOS's $Q_{47}$, $Q_{49}$ and signal $\emptyset_x$. The signal $\emptyset_x$ is changed from low level (zero volt) to high level ($V_{cc}$), or from high level ($V_{cc}$) to low level (zero volt) at the timing when the signal $\overline{\emptyset}_x$ as shown in FIG. 3 is changed from high level to low level, or from low level to high level, respectively.

The word and dummy word lines are precharged to the voltage $V_{cc}$ by the same latch circuit 30 as that in FIG. 2.

The output lines 12A, 12B, 12C and 12D of the decoder 20 are also precharged to the $V_{cc}$. Consequently, after completion of percharge, the gates of the NMOS's $Q_{47}$ in all the drivers are charged through the NMOS's $Q_{45}$ to $V_{cc}-V_{TH}(Q_{45})$. Thus, the NMOS's $Q_{47}$ are conductive when the signal $\emptyset_x$ applied to the sources is zero volt. Accordingly, the gate of the NMOS $Q_{49}$, which is connected to the drain of the NMOS $Q_{47}$, is at zero volt to be in the off-state, while the NMOS's $Q_{48}$ and $Q_{54}$ are conductive.

Then, when the output of the decoder 20 becomes definite in response to the address signals the outputs of the first and second partial decoders except the partial decoders 20A and 20B for the selected word line, for example, $W_0$ and $\overline{W}_D$ become zero volt, the NMOS's $Q_{45}$ in the driver the sources of which are connected to these partial decoders for non-selected word lines are conductive, and the gate voltage of the NMOS's $Q_{47}$ for non-selected word lines are discharged to zero through the NMOS's $Q_{45}$ which are conductive and the NMOS's $Q_{23}$ to $Q_{28}$ which are conductive in the decoder 20A. Consequently, the NMOS's $Q_{47}$ connected to the NMOS's $Q_{45}$ for non-selected word lines are turned off. The NMOS $Q_{47}$ for the selected word lines, for example, $W_0$ and $\overline{W}_D$ remains conductive. The voltage of the signal line 12B, which is not for the word line $W_0$ to be selected, is reduced to zero by the decoder 20C. Thus, the NMOS $Q_{48}$ for the word line $W_0$ remains conductive but the NMOS $Q_{54}$ for the word line $W_1$ is turned off.

When the signal $\emptyset_x$ becomes at high level ($V_{cc}$) after this decoder output is definite, the gate voltage of the NMOS $Q_{47}$ in the driver $10'_{01}$, $\overline{10}'_D$ becomes much higher than the original $V_{cc}-V_{TH}(Q_{45})$ by the bootstrap effect due to the capacitive coupling between the signal line 14 and the gate of the NMOS $Q_{47}$, and the NMOS $Q_{45}$ in these drivers becomes nonconductive, while the NMOS $Q_{47}$ becomes conductive. Accordingly, the NMOS $Q_{49}$ in these drivers is turned on. Thus, the voltage on the selected word lines $W_0$ and $\overline{W}_D$ connected to the source of the NMOS $Q_{49}$ is discharged to low level (zero volt). The other word lines are maintained at the voltage $V_{cc}$ by the latch circuit 30.

As described above, the driver $10'_{01}$ in FIG. 4 is different from that in FIG. 2 in that the driver $10'_{01}$ can be constructed by only NMOS.

In addition, it is unnecessary that the voltage on the selected word line be discharged through the long line 14 which has a large capacitance.

Therefore, discharge on the word line is more rapidly performed than in FIG. 2.

Figure 5:
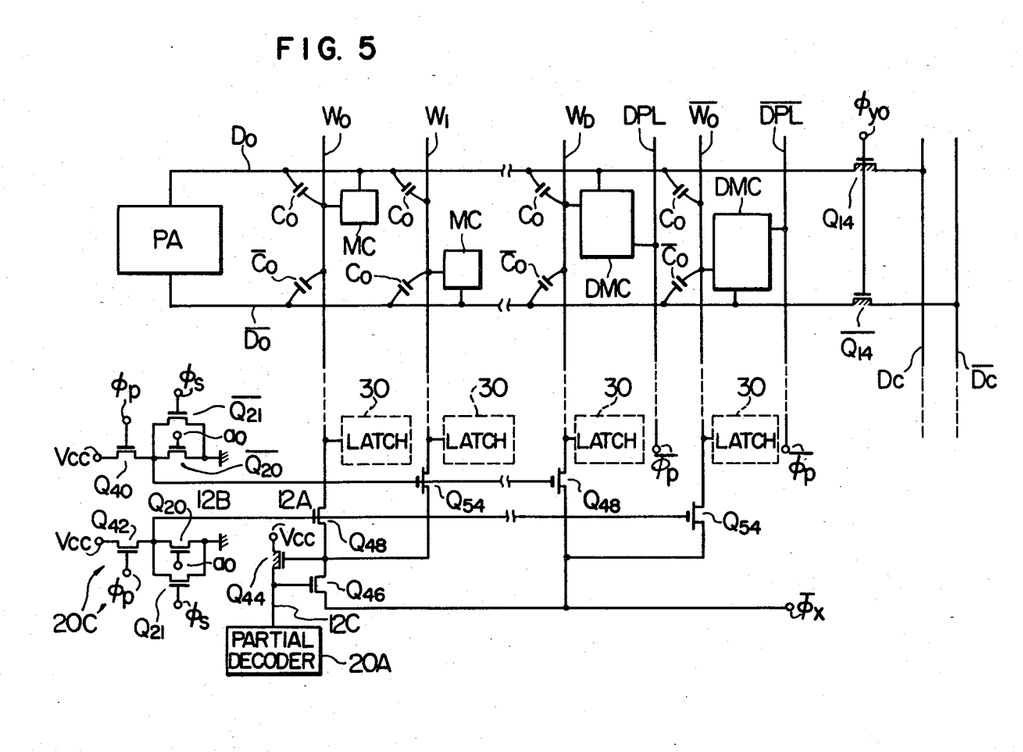
FIG. 5 is a schematic circuit diagram of the third embodiment of the dynamic memory according to the invention.
Figure 6A:
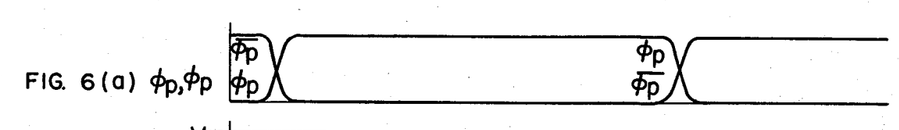
FIG. 6 is a timing chart of signals useful for explaining the operation of the fourth embodiment of the memory according to the invention.
Figure 6B:
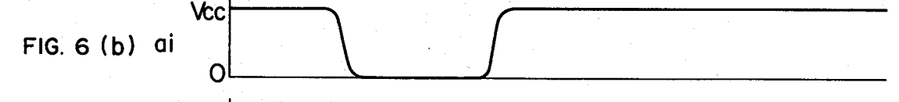
Figure 6C:
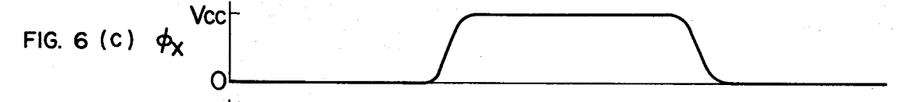
Figure 6D:
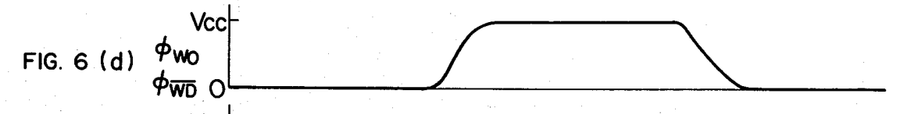
Figure 6E:
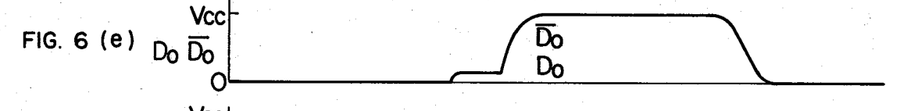
Figure 6F:
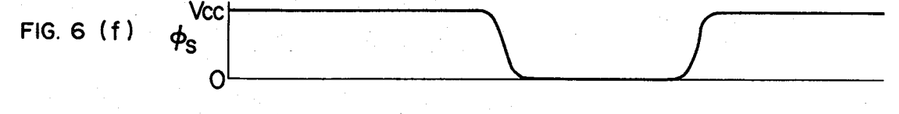

FIG. 5 shows a third embodiment of the invention, in which only a pair of data lines $D_0$ and $\overline{D}_0$ are illustrated, but in practice plural pairs of data lines are provided.

The memory of FIG. 5, as disclosed in the U.S. Pat. No. 4,044,340, is characterized in that a pair of data lines $D_0$ and $\overline{D}_0$ are arranged in parallel and adjacent to each other, and the memory cell and dummy cell are disposed only at one of the two intersections between each word line and each pair of data lines.

In FIG. 5, the memory cell MC, dummy cell DMC, preamplifier PA, common data lines $D_c$ and $\overline{D}_c$, latch circuit 30, and partial decoder 20A have the same constructions as those of FIGS. 1 and 2 and operate in the same way as those of the figures.

The memory circuit of FIG. 5 is different from that of FIGS. 1 and 2 in that the partial decoder 20C' has additionally NMOS's $Q_{21}$ and $\overline{Q}_{21}$ in the third partial decoder 20C of FIG. 2, and the decoder for selecting the dummy-cell word lines $W_D$ and $\overline{W}_D$ consists of the partial decoder 20C' and the NMOS's $Q_{48}$ and $Q_{54}$, and does not have the decoder 20B for dummy cell shown in FIG. 2. The latter difference means that the word lines $W_D$ and $\overline{W}_D$ for dummy word line are selected when the address signals $\overline{a}_0$ and $a_0$ are at low levels, respectively. This difference does not cause the selecting operation for dummy cell word line to differ from that of the memory of FIG. 2. In the memory of FIG. 5, the address signals $a_0$ and $\overline{a}_0$ are used to select the word line for dummy cell, thus the decoder becoming simple.

The former difference exists on the main circuits of the memories of FIGS. 5, 1 and 2. This difference presents an effect of sufficiently reducing the low-level voltage to be written in the memory cell MC when information is stored in the memory cell MC.

In FIG. 5, when information is stored in the memory cell, precharge and decode operation are performed in the same way as in the memory of FIG. 1, the voltage on the selected word line, for example, $W_0$ is changed from the $V_{cc}$ to zero volt. The change of this word line voltage permits the memory cell MC to be read from. In this embodiment, it is a feature that when the preamplifier PA is activated, the signal $\emptyset_s$ used therefor permits the NMOS $Q_{21}$, $\overline{Q}_{21}$ to be turned on, thereby keeping the voltage on the signal line 12A, 12B at zero volt. Thus, the NMOS $Q_{48}$, which has been conducting and is connected to the word line $W_0$, is turned off, and the word line $W_0$ becomes in the floating condition.

On the other hand, by the action of the preamplifier PA activated, one counterparts of all data line pairs are feld at the $V_{cc}$, but the other counterparts become at zero volt. The data line $W_0$ is coupled to all the data lines by a stray capacitance $C_0$, $\overline{C_0}$. Thus, when a half of all the data lines become at zero volt, the voltage on the word line $W_0$ is reduced to a negative voltage by the capacitive coupling. However, the voltage on the word line $W_0$ is never reduced to less than $-V_{TH}(Q_{48})$. If it were reduced thereto, the NMOS $Q_{48}$ would be turned on, permitting the current of the signal $\overline{\emptyset}_x$ at zero volt condition of flow to the word line $W_0$.

Under this condition, information is stored in the memory cell MC which is located at the intersection between the data line $D_0$ and word line $W_0$. Therefore, if the data line $D_0$ is at zero volt, the voltage across the capacitance $C_4$ within the memory cell MC depends on the difference between the minimum voltage $-V_{TH}(Q_{48})$ on the word line $W_0$ and the threshold value $V_{TH}(Q_4)$ of the PMOS $Q_4$ within the memory cell. In other words, if $V_{TH}(Q_{48}) \geq |V_{TH}(Q_4)|$, the capacitance $C_4$ in the memory has zero volt written therein, whereas if $V_{TH}(Q_{48}) < ''V_{TH}(Q_4)|$, the capacitance $C_4$ has a small positive voltage, $|V_{TH}(Q_4)| - V_{TH}(Q_{48})$ written therein.

Thus, if the values of the $V_{TH}(Q_4)$ and $V_{TH}(Q_{48})$ are determined to satisfy the former condition, for example, $-1.0$ (V) and 1.2 (V), or $-1.0$ (V) and 1.0 (V) respectively, then the low-level voltage to be written in the memory cell becomes zero volt. Consequently, the difference between the high-level voltage and low-level voltage to be written in the memory cell equals to the $V_{cc}$ (5 volts). In the memories of the first and second embodiments as described, since the minimum voltage on the word line is zero volt, the low-level voltage to be written in the capacitance of the memory cell is $|V_{TH}(Q_4)|$. Therefore, the difference between the high-level voltage and low-level voltage to be written in the memory cell becomes about 4 volts. The memory of FIG. 5 is able to store a larger voltage difference which is effective for high-speed reading, prevention of erroneous operation, and increase of the refresh cycle.

The above examples employ PMOS's for the memory cells and NMOS's or NMOS's and PMOS's in the peripheral circuits as described. In this invention, it is also possible to use NMOS's for the memory cells and PMOS's or PMOS's and NMOS's in the peripheral circuits. In other words, in each of the embodiments as described previously, all the NMOS's are replaced by PMOS's, all the PMOS's by NMOS's, ground potential by the source voltage $V_{cc}$, and the source voltage $V_{cc}$ by ground potential. In addition, a pulse changing from low level to high level is replaced by a pulse changing from high level to low level. Therefore, in the fourth embodiment, the signals $\emptyset_p$, $\overline{\emptyset}_p$, address signal $a_i$, and signals $\overline{\emptyset}_x$ and $\emptyset_s$ are replaced by the signals changing in level as shown in FIGS. 6a, 6b, 6c and 6f, respectively. The operation of the memory of such construction can be easily understood from FIG. 6. In this embodiment, the data lines $D_0$ and $\overline{D}_0$ are precharged to be at low level by the precharge signal $\emptyset_P$, and also the voltage on the word line is precharged to be low level. Selected word lines, for example, $W_0$ and $\overline{W}_D$ have voltages $\emptyset_{W0}$ and $\emptyset_{\overline{WD}}$ increased from low to high level, and thereby information is read from the memory cell. As a result, the data line $D_0$ remains at zero volt, and then is increased to $V_{cc}$ by the preamplifier after the data line $\overline{D}_0$ is changed to a voltage slightly higher than zero volt.

In this memory, it is also possible to increase the speed at which word lines are selected or the speed at which the dummy cell is read from, similarly as described in the first embodiment. The voltage between the source and gate of PMOS in the driver for causing change of voltage on the selected word line is not changed regardless of voltage change on the word line. Since the source and drain of NMOS in memory cell are connected to the data line and capacitance, respectively, when the voltage on the data line connected to the memory cell to be read from is changed in accordance with the information stored in the memory cell to be read from, the voltage between the source and gate of NMOS in the memory cell increases as the voltage on word line rises.

Figure 7:
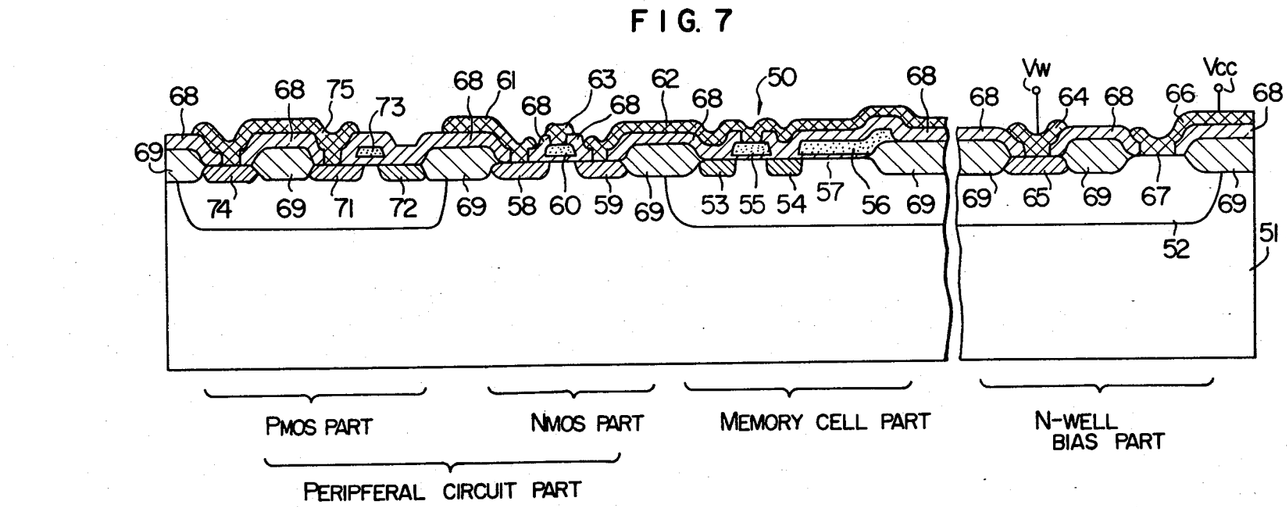
FIG. 7 is a cross-sectional view of the memory according to the invention.

FIG. 7 shows a cross-section of the memory of the first to third embodiments of the invention. There is shown a P-type conductivity Si-substrate 51 having a resistivity, $\rho_{sub}$ of about 40 $\Omega$-cm and thickness of 400 $\mu$m. On this substrate 51 is formed an N-type conductivity well 52 having the impurity concentration of about $10^{15}$ to $10^{16}$ cm$^{-3}$ and the depth of 3 to 6 $\mu$m for forming memory cells therein. The memory cell portion in the substrate surface over the N-type well 52 have P+ impurity layers 53 and 54 with an impurity concentration higher than the N-type well as source and drain electrodes, and a gate 55 of a good conducting material such as a polycrystalline silicon, to form a switching PMOS. In addition, the memory cell portion includes a gate electrode 56 biased at ground potential and a hole inverted layer 57 to form a capacitance therebetween, which form a single-transistor type memory cell. Although a plurality of such single-transistor memory cells are formed, one memory cell is shown for simplicity. In this structure, the gate electrode 55 is connected at a contact portion 50 to a word line 62 made of aluminum. Similarly, the P-type diffusion layer 53 forms a part of the data line of P-type diffusion layer. A peripheral circuit in the surface of the P-type Si-substrate 51 where the N-type well 52 is not formed, includes a PMOS portion and an NMOS portion and has formed therein a decoder, a driver, a preamplifier or the like. In FIG. 7, a single NMOS and a PMOS are illustrated. The NMOS is provided in the P-type substrate 51 and formed of an N-type impurity layers 58 and 59 as source and drain electrodes, and a gate electrode 60 provided on the substrate layer through an insulator 68. The source 58 and drain 59 are connected to low-resistance electrode materials 61 and 62, and the gate 60 to a low-resistance electrode material 63. The PMOS is provided in an N-type conductivity well 70 in the P-type substrate 51 and formed of P-type impurity layers 71 and 72 as its source and drain and a gate electrode 73.

These PMOS and NMOS are interconnected to form a complementary MOS circuit.

Figure 8:
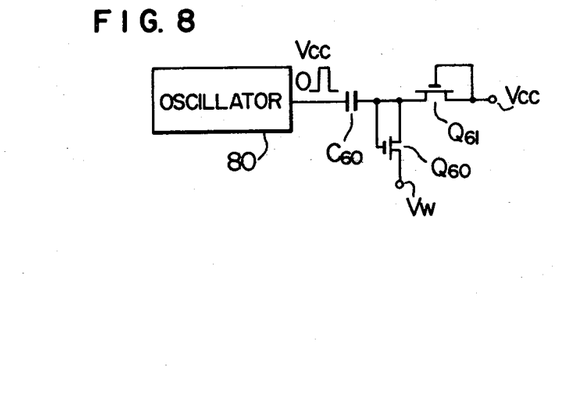
FIG. 8 is a circuit diagram of the well bias voltage generating circuit used for the memory according to the present invention.

The well 70 is required to be supplied with a voltage equal to or higher than the voltage to be applied to the source electrode 71, but here a P-type impurity layer 74 is connected to the source electrode 71 by a conductor 75 of aluminum or the like, thereby the well 70 being supplied with the same voltage as that to the source electrode 71. The N-type well 52, upon operation of circuit, is supplied with a voltage $V_W$ higher than the $V_{cc}$ through electrodes 64 and an N-type impurity layer 65. When power is applied to the memory circuit, an electrode 66 to which $V_{cc}$ is applied, and a Schottky diode 67 formed at the interface between the electrode 66 and the N-type well 52 cooperates to increase the potential of the N-type well 52 with the increase of the source voltage $V_{cc}$ without delay. As a result, for example, the P+ layer 53 of the PNP-transistor formed of the diffusion layer 53, well 52 and substrate 51 rapidly increases its potential to a value higher than the potential of the N-type well 52, and thereby preventing a great amount of current from flowing between the P+ layer 53 and P-type substrate 51, which current is caused by forward biasing the P+N junction therebetween. In addition, upon operation of memory, the voltage $V_W$ is selected to be much higher than the $V_{cc}$, thereby preventing the PNP transistor from being forward biased. Shown at 68 is an interlayer insulating film and 69 an oxide insulation region. To the substrate 51 is applied −3 volt. The voltage $V_W$ is generated from the circuit as shown in FIG. 8. An oscillator 80 in FIG. 8 supplies a train of pulses with low and high levels of zero and $V_{cc}$ volts, respectively, to a rectifying circuit consisting of a capacitance $C_{60}$, and NMOS's $Q_{60}$ and $Q_{61}$. The NMOS $Q_{61}$ of the rectifying circuit is supplied at its drain with the $V_{cc}$. The NMOS $Q_{60}$ produces at its source the output voltage $V_W$ as expressed by $$V_W = 2V_{cc} - V_{TH}(Q_{60}) - V_{TH}(Q_{61})$$

which will be much larger than $V_{cc}$.

In the structure of FIG. 7, it is possible that the impurity diffusion layers 53 and 54 for the source and drain of memory cell are not provided but a metal electrode is provided to penetrate the insulating film 68 on the diffusion layer 53 to the surface of the substrate 51 and to be insulated from the word line 62. In this case, a Shottky diode is formed between this metal electrode and the substrate 51, with this metal electrode connected to the data line. Thus, the process for making the diffusion layers 53 and 54 can be eliminated.

As stated above, a memory cell is provided within the well 52 and the junction between the well 52 and the substrate 51 is reverse biased by a predetermined voltage, whereby electrons and holes, which are generated in the substrate 51 outside the well 52 by application of α-ray, are prevented from entering into the well 52. Consequently, the information stored in the capacitance portion of the memory cell is never destroyed by the electrons and holes. In the above embodiment, the PMOS for making the peripheral circuit is formed in the well 70 provided separate from the well 52.

Thus, if the well for memory cell and the well for peripheral circuit are separately provided, it is prevented that noise produced when the peripheral circuit is operated is coupled to the data line of the memory cell portion. However, if the noise thus produced can be reduced, the PMOS for making peripheral circuit can also be provided within the well 52 for making the memory cell.

The metal oxide field-effect transistor used in the above embodiment can be replaced by a junction-type field effect transistor or a Schottky gate type field-effect transistor.

Accordingly, the dynamic memory of the invention has the capability of preventing information from being destroyed by the application fo α-ray, and of speeding up the memory selecting operation.

We claim:
1. A dynamic monolithic memory comprising:
a plurality of data lines;
a plurality of word lines;
a plurality of memory cells provided at the intersections between said data lines and word lines, each memory cell having a capacitance for storing a first or a second voltage and a field-effect transistor for connecting said capacitance to the corresponding data line, said field-effect transistor having a gate electrode connected to said corresponding word line, a first electrode connected to said corresponding data line and a second electrode connected to said capacitance;
means for charging said data lines to a third predetermined voltage before reading the memory cell, said third voltage cooperating with said first and second voltages so that said first and second electrodes are operated during a memory reading operation as source and drain electrodes, respectively, regardless of whether said capacitance is storing said first or said second voltage; and
a driver means for applying a predetermined selecting voltage to said word line, the difference between said selecting voltage and said third voltage exceeding a predetermined threshold value of said transistor.

2. A dynamic monolithic memory according to claim 1, further comprising:
a plurality of dummy word lines;
a plurality of dummy cells provided at the intersections between said dummy word lines and said data lines, each of said dummy cells having a capacitance with a half of the capacity of the first-mentioned capacitance and a field-effect of the same type as said field effect transistor of said cell for connecting said capacitance to the corresponding data line, said dummy cell being read from when the memory cell connected to the data line is read from, to change the voltage on the data line to an intermediate value between two possible voltages on the data line;
a flip-flop connected to a pair of data lines of the plurality of data lines to differentially amplify the voltages on said pair of data lines, said flip-flop substantially holding one counterpart of the pair of data lines at said third voltage and changing the voltage on the other counterpart to the other value.

3. A dynamic monolithic memory according to claim 1 or 2, wherein said transistor is an N-channel field-effect transistor and said third voltage is not higher than any of said first and second voltages.

4. A dynamic monolithic memory according to claim 1 or 2, wherein said transistor is a P-channel field effect transistor, and said third voltage is not lower than any of said first and second voltages.

5. A dynamic monolithic memory according to claim 1 or 2, wherein said driver means includes means for charging all the word lines to a nonselecting voltage before memory cell selection, and means for discharging, upon memory cell selection, the voltage on the word line connected with a memory to be selected, to a selecting voltage.

6. A dynamic monolithic memory according to claim 5, wherein said driver includes a pulse generator has said nonselecting voltage before memory cell selection and said selecting voltage upon memory cell selection, a connecting field-effect transistor for connecting each of said word lines to said pulse generator, and a decoder means connected to the gate of said connecting field-effect transistor to produce, before memory selection, a voltage for turning on said connecting field-effect transistor, and to produce, upon memory cell selection, a voltage to be applied to the gate of said connecting field-effect transistor corresponding to a word line to be selected, thereby turning on said transistor, and a voltage to be applied to the gates of said connecting field-effect transistors corresponding to the word lines except the word line to be selected, thereby turning on the transistors.

7. A dynamic monolithic memory according to claim 6, wherein said connecting field-effect transistor is provided at its gate with a field-effect transistor which has its drain connected to the gate of said connecting field-effect transistor, its source supplied with a voltage for turning on said connecting field-effect transistor, and its gate connected to said word line, said field-effect transistor becoming conductive when the pulse from said pulse generator is changed from the nonselecting voltage to the selecting voltage.

8. A dynamic monolithic memory according to claim 5, wherein said driver includes means for setting each word line to said nonselecting voltage, a word driver transistor provided between each word line and a selecting voltage source, and a decoder means connected to the gate of said word driver transistor to supply a voltage to and turn on said word driver transistor that is connected to the word line to be selected.

9. A dynamic monolithic memory according to claim 5, wherein said discharging means has a discharging field-effect transistor provided at each pair of adjacent word lines and connected to said selecting voltage to discharge said voltage, a connecting field-effect transistor for connecting said discharging field-effect transistor to said each pair of adjacent word lines, and means for turning on said discharging field effect transistor and connecting field effect transistor connected to the word line to be selected.

10. A dynamic monolithic memory according to claim 9, wherein said data line includes plural pairs of data lines closely disposed in parallel, said memory cell is provided at either of the two intersections between each data line pair and each of said word line, and said connecting field-effect transistor is provided as its gate with means for applying said selecting voltage after selection of word line.

11. A dynamic monolithic memory according to claim 1 or 2, which is constructed to have a semiconductor substrate of a first conductivity type, and a well region of a second conductivity provided in said substrate, said memory cell being provided in said well region.

12. A dynamic monolithic memory according to claim 11, wherein means for applying a certain bias voltage to said well region supplies a voltage much higher than said third voltage to be applied to said second electrode of said field effect transistor.

13. A dynamic monolithic memory according to claim 11, further comprising a Schottky diode formed of said well region and a metal electrode provided close to said well region, said metal electrode being supplied with said third voltage.

14. A dynamic monolithic memory comprising:
a plurality of data lines;
a plurality of word lines;
a plurality of memory cells provided at the intersections between said data lines and word lines, each memory cell having a capacitance for storing a first or a second voltage and a field-effect transistor for connecting said capacitance to the corresponding data line, said field-effect transistor having a gate electrode connected to said corresponding word line, a first electrode connected to said corresponding data line and a second electrode connected to said capacitance;
means for charging said data lines to a third predetermined voltage before reading the memory cell, said third voltage cooperating with said first and second voltages so that said first and second electrodes can be operated as source and drain electrodes, respectively; and
a driver means for applying a predetermined selecting voltage to said word line, the difference between said selecting voltage and said third voltage exceeding a predetermined threshold value of said transistor,
wherein the dynamic monolithic memory is constructed to have a semiconductor substrate of a first conductivity type, and a well region of a second conductivity provided in said substrate, said memory cell being provided in said well region.

15. A dynamic monolithic memory according to claim 14, further comprising:
a plurality of dummy word lines;
a plurality of dummy cells provided at the intersections between said dummy word lines and said data lines, each of said dummy cells having a capacitance with a half of the capacity of the first-mentioned capacitance and a field-effect transistor for connecting said capacitance to the corresponding data line, said dummy cell being read from when the memory cell connected to the data line is read from, to change the voltage on the data line to an intermediate value between two possible voltages on the data line;
a flip-flop connected to a pair of data lines of the plurality of data lines to differentially amplify the voltages on said pair of data lines, said flip-flop substantially holding one counterpart of the pair of data lines at said third voltage and changing the voltage on the other counterpart to the other value.

16. A dynamic monolithic memory according to claim 14 or 15, further comprising a Schottky diode formed of said well region and a metal electrode provided close to said well region, said metal electrode being supplied with said third voltage.

* * * * *